United States Patent [19]
Steudel

[11] 3,743,960
[45] July 3, 1973

[54] CIRCUIT FOR DRIVING FREQUENCY STANDARD SUCH AS TUNING FORK

[75] Inventor: Guetz Wolfgang Steudel, Flemington, N.J.

[73] Assignee: RCA Corporation, Princeton, N.J.

[22] Filed: Mar. 1, 1972

[21] Appl. No.: 230,769

[52] U.S. Cl. ........................ 331/1 A, 330/35, 331/8, 331/18, 331/27, 331/36 R, 331/116 M
[51] Int. Cl. ........................ H03b 3/04, H03b 5/30
[58] Field of Search .................... 331/1 A, 8, 18, 25, 331/27, 36 R, 116 M

[56] References Cited

UNITED STATES PATENTS 3,616,638 11/1971 Bennett et al. .................. 331/25 X

*Primary Examiner*—Roy Lake
*Assistant Examiner*—Siegfried H. Grimm
*Attorney*—H. Christoffersen et al. and Samuel Cohen

[57] ABSTRACT

A frequency standard such as a tuning fork initially is driven into oscillation by a high gain amplifier. The tuning fork then drives the amplifier and the latter drives a phase locked loop. When the signal produced by the phase locked loop is at the resonant frequency of the tuning fork and is in a predetermined phase relationship thereto, the loop itself rather than the amplifier is connected to drive the tuning fork, to provide stable tuning fork operation.

13 Claims, 6 Drawing Figures

PATENTED JUL 3 1973 3,743,960

SHEET 1 OF 3

CIRCUIT FOR DRIVING FREQUENCY STANDARD SUCH AS TUNING FORK

BACKGROUND

With the advent of integrated circuit techniques for providing electronic circuitry which is both small in physical size and low in power requirements, it has become desirable to implement many electronic timepieces by utilizing integrated circuits. In many types of electronic timepieces, it is relatively simple to provide the integrated circuitry. However, in some types of timepieces, for example automobile clocks and the like, a relatively hostile environment is encountered. For example, in the case of an automobile clock, a rough, jarring condition can be experienced when the car is in motion. Moreover, in an automobile and some other applications, wide temperature variations can be experienced. In addition, in a portable application such as a car clock or the 'ike, the voltage supplied by a voltage source can vary widely providing fluctuating line supply voltages. Moreover, in an unattended status, the timepiece may provide a long duration drain on the power source wherein a reduced power drain is, of course, desirable.

In some of the existing electronic timepiece circuits, stability is provided by utilizing very expensive crystal controlled circuits. These circuits are expensive inasmuch as a reasonably accurate crystal is very expensive. Other circuits utilize relatively inexpensive crystals, and achieve stability by means of a very elaborate, expensive electronic circuit. In either of these cases, the timepiece becomes relatively expensive. Consequently, it is desirable to provide a timepiece which utilizes a very inexpensive element in place of the crystal while permitting the utilization of a relatively inexpensive integrated electronic circuit.

In providing integrated circuits, the metal-oxide semiconductor (MOS) techniques are frequently used. In this type of integrated circuit, it is well known that a conduction path between two terminals is provided. The terminals are generally known as the source and drain electrodes. A control or gate electrode controls the conductivity of the conduction path and the current from source to drain. These types of devices can be fabricated with conduction paths of different lengths and widths, whereby the impedance (and, thus, the current carrying capability) is affected. Also, by varying the structure, the semiconductor device may be rendered conductive when the gate electrode is positive relative to the source (NMOS) or vice versa (PMOS). If P-type devices and N-type devices are both used in a circuit, complementary symmetry MOS (COS/MOS or CMOS) circuitry is produced. This technology is adaptable to small-to-medium scale electronic devices.

SUMMARY OF THE INVENTION

In this clock circuit, a resonant reference device, such as a tuning fork, is used to provide a resonant frequency signal. The circuit includes a start-up portion whereby the resonant reference device is started in oscillation to provide the resonant frequency signal. The circuit provides a phase shift in the signal and returns a portion of the signal to the resonant reference device in order to establish frequency stability and to maintain operation thereof. A counter circuit divides the resonant frequency signal and produces a further output signal. This output signal controls the operation of a regulator-driver circuit which drives a suitable motor with an amplitude regulated signal.

BRIEF DESCRIPTION OF THE PREFERRED EMBODIMENTS

Figure 1:
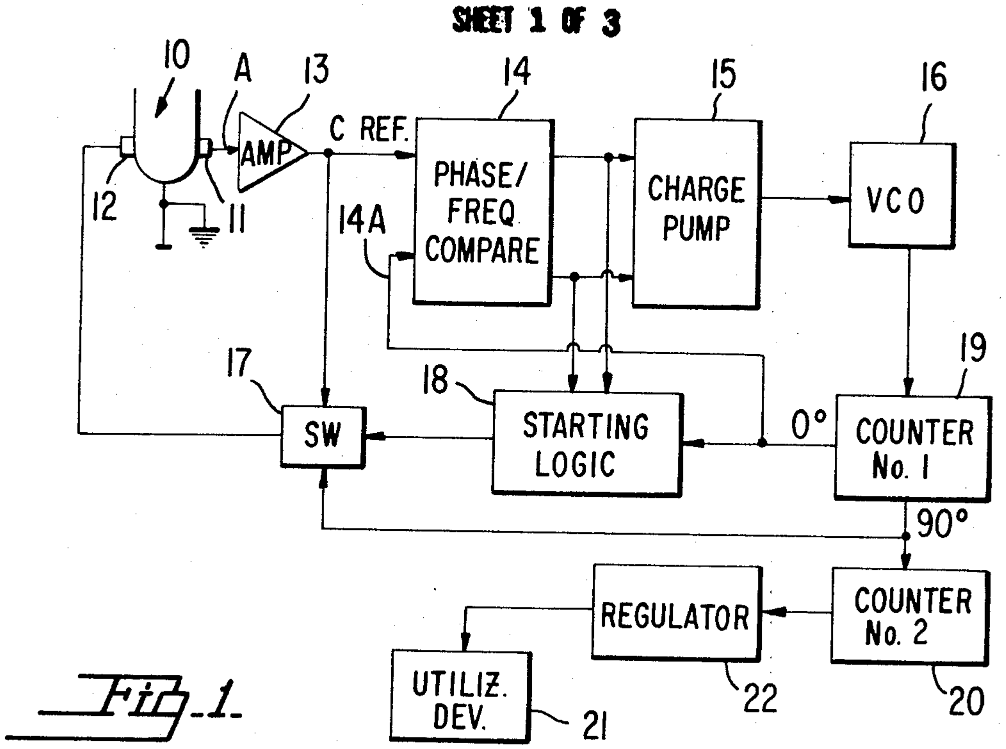
FIG. 1 is a block diagram of a circuit embodying the instant invention.

In the following description, similar components in the several drawings are designated by the same reference numeral.

Referring now to FIG. 1, there is shown a block diagram of one embodiment of the instant invention. In the embodiment shown in FIG. 1, tuning fork 10 is a time reference source which is utilized in practicing the invention but does not form any portion thereof. The tuning fork is fabricated of sheet metal, for example, and is designed to operate at a specific resonant frequency. Typically, in one embodiment of the invention, the tuning fork resonant frequency is 480 Hz. The base of tuning fork 10 is connected to a suitable reference potential, for example ground. A pair of piezo-electric crystals 11 and 12 are affixed to the tuning fork. In the schematic representation of FIG. 1, the crystals 11 and 12 are shown attached to the tines of the tuning fork. The specific configuration of the tuning fork, as noted, is not a portion of this invention.

Crystal 11 is the pickup crystal which is utilized to detect motion of the associated tine and to produce an output signal representative of the operation (i.e., resonant frequency) of tuning fork 10. Crystal 12 is the drive crystal and is utilized to return a signal to the tuning fork to maintain the tuning fork in oscillation once the oscillation has begun.

Figure 4:
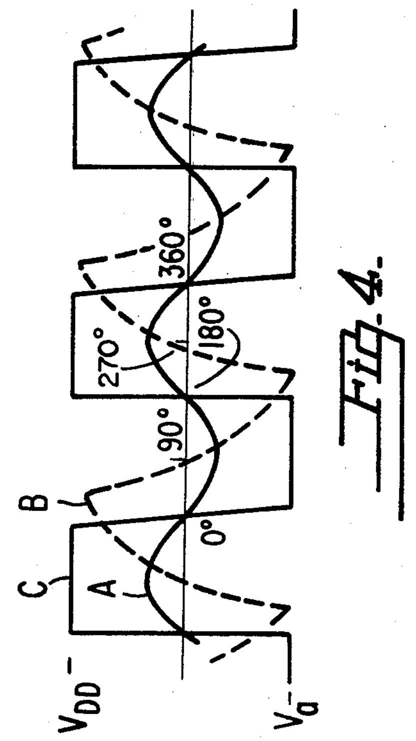

The output signal produced by crystal 11 (waveform A, FIG. 4) is supplied to amplifier 13 which, in this example, has an extremely high gain, for example on the order of 120 db. The signal produced by amplifier 13 (waveform C, FIG. 4) is supplied to phase/frequency comparator 14 and to switch 17. In addition, switch 17 receives signals from starting logic circuit 18 and counter 19. As will be described hereinafter, in accordance with the signal supplied by starting logic circuit 18, switch 17 will selectively connect either the output of amplifier 13 or the output of counter 19 to crystal 12. As noted supra, amplifier 13 has extremely large gain wherein any small signal (A) or even noise generated by crystal 11 or internally of amplifier 13 will cause a sufficiently large signal to be applied via switch 17 to crystal 12 to cause fork 10 to be forced into the oscillating mode. When the signal supplied by fork 10 at crystal 11 is of sufficient frequency and amplitude, the remainder of the circuit will detect this condition and cause switch 17 to change condition wherein amplifier 13 is disconnected from crystal 12.

As noted supra, an output of amplifier 13 is coupled to an input terminal of phase/frequency comparator 14. Another input terminal of phase/frequency comparator 14 is connected to receive an output signal from counter 19. The output terminals of comparator 14 are connected to two input terminals of charge pump 15. In addition, the output terminals of comparator 14 are connected to starting logic circuit 18. The output of charge pump 15 is connected to an input of voltage controlled oscillator (VCO) 16. The output of VCO 16 is connected to the input terminal of counter 19. One output terminal of counter 19 is, as noted supra, connected to an input of comparator 14. In addition, counter 19 supplies input signals to starting logic circuit 18, to switch 17 and to counter 20. The output of counter 20 is connected to utilization device 21 via regulator 22. The output of starting logic circuit 18 is connected to the control element of switch 17.

As suggested supra, when the circuit is in the initial condition, starting logic circuit 18 provides a control signal to switch 17 whereby switch 17 connects the output of amplifier 13 to drive crystal 12. Regardless of whether a small signal is generated by pickup crystal 11 or as a result of internal noise of amplifier 13, a drive signal is ultimately supplied to crystal 12 via switch 17 to cause fork 10 to achieve oscillation at the resonant frequency thereof. The signal supplied to switch 17 by starting logic circuit 18 is produced inasmuch as the starting logic circuit recognizes that VCO 16 is not locked-in on the fork frequency at this time.

Once the fork is oscillating, the frequency of the reference input signal supplied from the fork circuit to comparator 14 is relatively stable at the fork frequency. With this stable frequency, the phase lock loop (PLL) including comparator 14, charge pump 15, VCO 16 and counter 19 operates such that the VCO can "lock-in" and produce an output signal having a frequency which is related in the manner discussed below to the fork frequency. That is, comparator 14 receives, at terminal 14A, signals produced by the counter 19, which counter is driven by the VCO 16. Charge pump 15 receives signals from phase/frequency comparator 14 which represent the difference between the signal from VCO 16 and the reference input signal. Charge pump 15 may include a capacitor which charges as a function of the signal produced by comparator 14. This capacitor supplies a control signal to VCO 16. The signal supplied by charge pump 15 and the capacitor threin provides the voltage which controls the oscillation frequency of VCO 16. Typically, the frequency of signal produced by VCO 16 will be four times the frequency of the fork.

The signal produced by VCO 16 is supplied to and divided by counter 19, and a signal of frequency VCO/4 is supplied by counter 19 to comparator 14. The signal supplied to comparator 14 from counter 19 is defined as the 0° phase point of either the VCO or VCO/4 signals. This zero degree phase point is then compared with the counterpart signal supplied via amplifier 13. In accordance with the comparison and the results thereof, signals are supplied to starting logic circuit 18 and to charge pump 15 to effect operation of these circuits. The signal supplied to charge pump 15 will affect the signal produced by VCO 16 and attempt to establish identity of the 0° output (i.e., leading edge) of the signal produced by counter 19 with the leading edge of the REF signal supplied to comparator 14. The signal supplied to starting logic circuit 18 will determine the signal condition supplied to switch 17.

The signal supplied to switch 17 from counter 19 is at the 90° (or 270°) phase point of the signal (VCO) which is supplied to counter 19. This signal is selectively supplied to drive crystal 12 on fork 10 when switch 17 is appropriately conditioned by the signal from starting logic circuit 18. Whether the signal from counter 19 is the 90° or 270° phase point is determined by the physical mounting of the drive crystal on the fork and the orientation of the crystal relative to the fork oscillation. Thus, when the starting logic 18 recognizes that the phase lock loop of the circuit has locked-in on the fork frequency, a signal is supplied to switch 17 whereby amplifier 13 is disconnected from drive crystal 12 and the 90° (or 270°) signal is supplied from counter 19 through switch 17 to drive crystal 12. This signal reinforces the operation of fork 10 and continues resonant oscillation thereof.

In addition, an output signal from counter 19 is supplied to counter 20. Counter 20 may be a standard ripple or count-down counter comprising a plurality of cascaded flip-flops which provides a divide-by-two function for each flip-flop therein. The output of counter 20 is supplied to utilization device 21 via regulator 22. In this implementation, utilization device 21 may be a synchronous motor or the like which is utilized to drive a clock apparatus or similar device. Regulator circuit 22 may be included in the circuit to produce a voltage which is relatively constant despite large fluctuations in supply voltage in order to provide suitable control over the signals supplied to utilization device 21. However, it is understood that regulator device 22 is not essential to the operation of the circuit as shown and described.

Figure 2:
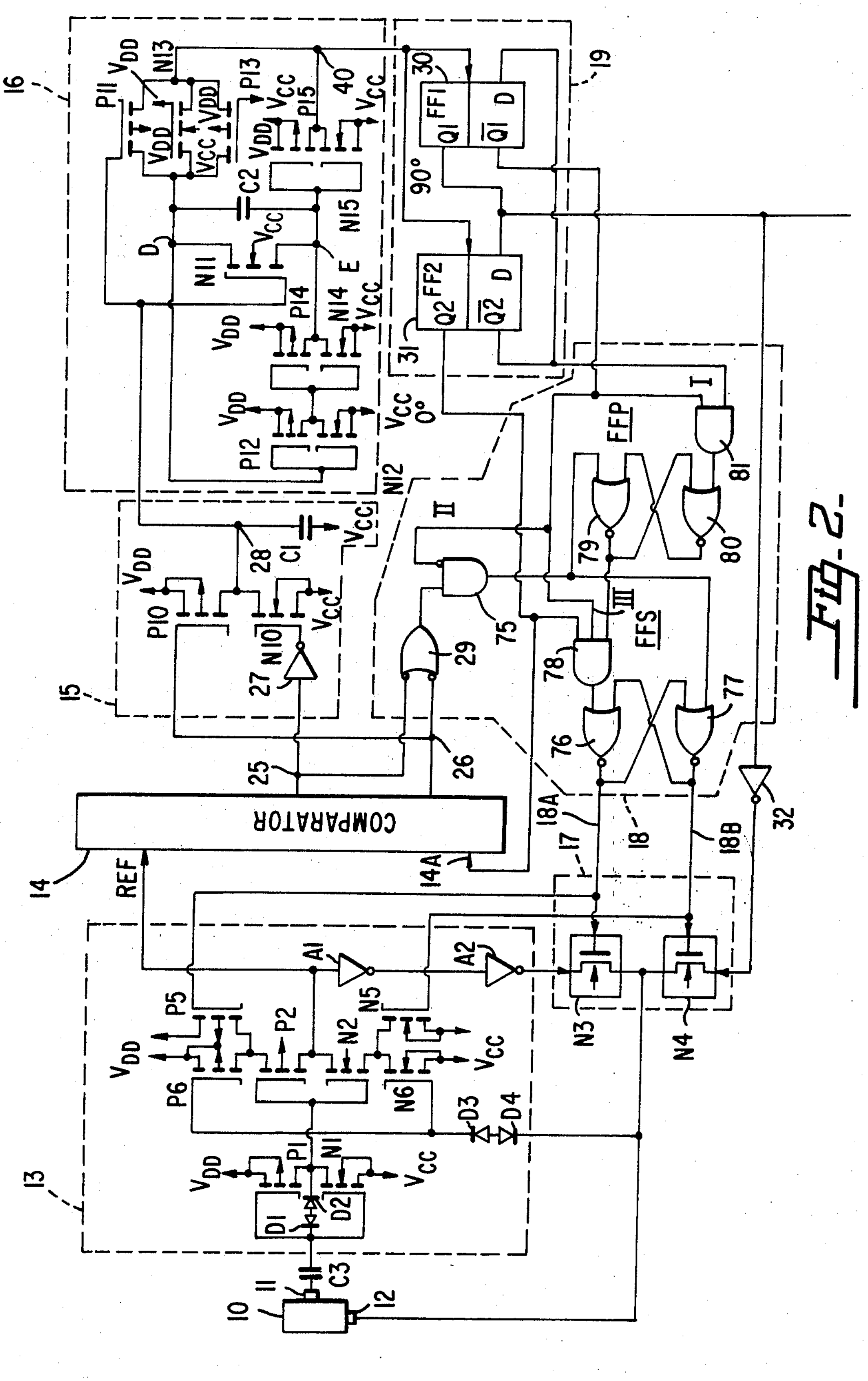
FIGS. 2 and 3 are schematic diagrams of portions of the circuit shown in FIG. 1.
Figure 3:
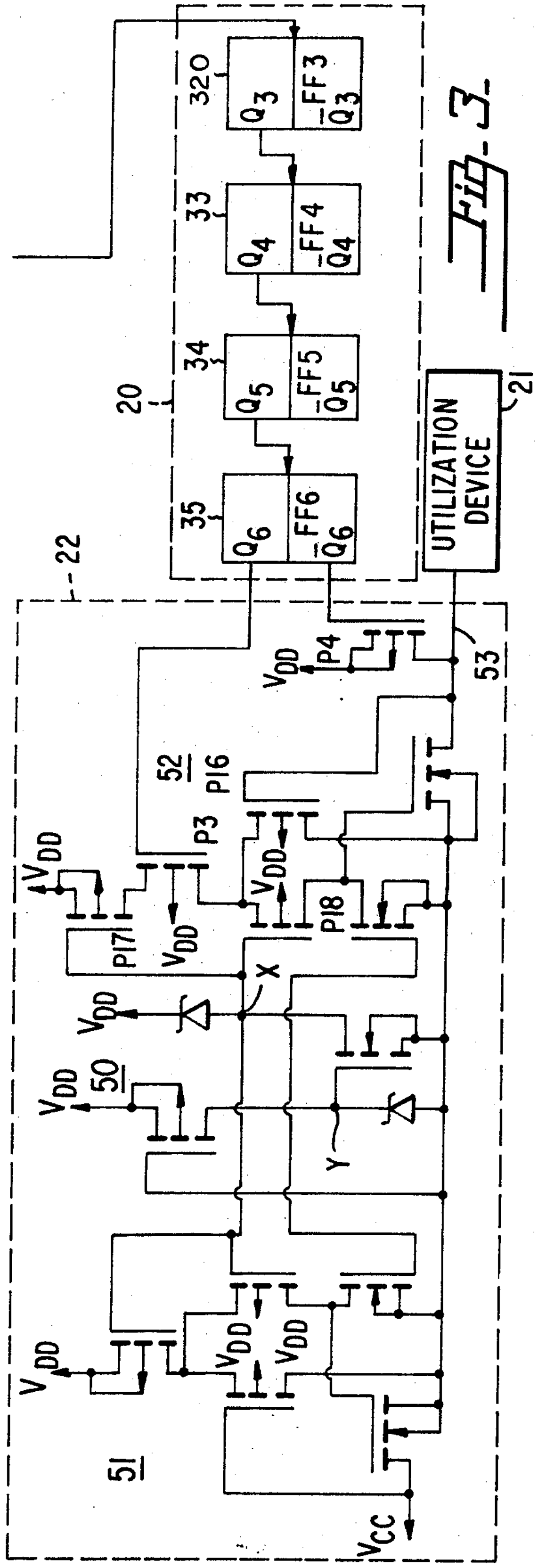

Referring now to FIGS. 2 and 3, there is shown a schematic diagram (including some block diagram portions) of portions of the FIG. 1 circuit. Concurrent reference is made to FIGS. 4 and 5 wherein waveforms of signals related to the circuit are shown.

AMPLIFIER SECTION

The signal source or fork is represented by block 10. The pickup crystal 11 and drive crystal 12 are shown affixed thereto. Pickup crystal 11 is connected via AC coupling capacitor C3 to the gate electrodes of MOS semiconductor devices P1 and N1, respectively. The source electrode and the substrate of device P1 are connected to source $V_{DD}$ while the drain electrode of device P1 is connected to the drain electrode of device N1. The source electrode and the substrate of device N1 are connected to source $V_{CC}$. Source $V_{CC}$ may be any suitable reference potential. As will be described hereinafter, a suitable regulating source for providing a regulated voltage $V_{CC}$ is provided. Source $V_{DD}$ is a source of approximately +12.6 volts which is supplied to the circuit. Diodes D1 and D2 have the anodes thereof connected together. The cathode of diode D1 is connected to the gate electrodes of devices P1 and N1 while the cathode of diode D2 is connected to the common junction of the drain electrodes of device P1 and device N1. Thus, diodes D1 and D2 provide a high impedance feedback network and function to establish a DC voltage level on the gate electrodes of devices P1 and N1. This DC voltage level biases the amplifier formed by devices P1 and N1 into the linear operating, high gain region.

This last-named common junction is connected to the gate electrodes of devices P2 and N2. The drain electrode of device P2 is connected to the drain electrode of device N2. This common connection is also connected as an input to amplifier A1 and to the reference (REF) input of comparator 14. The substrate of devices P2 and N2 are connected to source $V_{DD}$ and source $V_{CC}$, respectively. The source electrode of device P2 is connected to the drain electrode of device P6 and to the drain electrode of device P5. The substrates of devices P5 and P6 along with the source electrodes thereof are connected to source $V_{DD}$. The source electrode of device N2 is connected to the drain electrodes of devices N6 and N5. The substrates of devices N5 and N6, as well as the source electrodes thereof, are connected to source $V_{CC}$. The gate electrodes of P6 and N6 are connected together and to the cathode of diode D3. The anodes of feedback diodes D3 and D4 are connected together. The cathode of diode D4 is connected to drive crystal 12 and to switch 17.

In FIG. 2, switch 17 is symbolically shown as a pair of N-type devices N3 and N4 connected in series. Practically, this arrangement, which is used for simplicity, may not work too efficiently and other switches are contemplated (e.g., see FIG. 6) The source electrode of device N4 is connected to receive an output signal from counter 19 as will be described hereinafter. The source electrode of device N3 is connected to receive an output supplied by amplifier A2. The input of amplifier A2 is connected to the output of amplifier A1. Amplifiers A1 and A2 are substantially similar to the amplifier which comprises devices P1 and N1. The gate electrodes of devices N3 and N4 of symbolic switch 17 are connected to the outputs of start flip-flop (FFS) in starting logic circuit 18 via lines 18A and 18B whereby the signals received are complementary signals so that devices N3 and N4 are mutually exclusively operative. In addition, the gate electrodes of devices P5 and N5 are connected to lines 18A and 18B, respectively. Thus, when device N3 is operative, device P5 is inoperative and vice versa. Similarly, when device N3 is operative, device N5 is inoperative and vice versa.

For purposes of illustration, a description of the opration of starting logic circuit 18 will be temporarily postponed but it will be assumed that the signal supplied along line 18A to the gate electrode of device N3 is a positive signal. By positive signal, it is meant a signal that is relatively positive or close to the value of the $V_{DD}$ source. This signal may be otherwise designated as a "high" signal or a binary 1 signal. Conversely, a signal which is close to the value of $V_{CC}$ (or binary 0) is supplied to the gate electrode of device N4. Consequently, device N4 is nonconductive and device N3 is conductive. This is the condition when the circuit is in the initial condition and has not been operative or for some reason the phase lock loop operation thereof has not been established. Thus, with device N3 rendered conductive, the output of amplifier A2 is connected via device N3 to the feedback path comprising diodes D3 and D4 as well as to drive crystal 12. As a result, the signal from amplifier A2 will cause fork 10 to be driven in its oscillating or vibrating manner. The DC feedback loop including diodes D3 and D4 is connected across three stages of amplification, viz. A1, A2 and the amplifier mixer circuit comprising devices P2, P6, N2 and N6. The band width limitations established by the amplifier circuit and the capacity of crystal 12 will prevent amplification of signals which are of improper frequency. For example, the circuit operates substantially as a low pass circuit wherein all of the higher harmonics are substantially eliminated.

As suggested supra, it is initially assumed that fork 10 is in the inoperative condition producing no output signal via pickup crystal 11. Thus, theoretically, the signal supplied to drive crystal 12 via the amplifier circuit 13 is also zero. However, as a practical matter, fork 10 will generally produce at least a noise-type signal which can be operated upon by amplifier 13. Conversely, if fork 10 is a noiseless fork, amplifier 13 has such high gain, i.e., approximately 120 db or a gain of about 1 million, that the amplifier is extremely sensitive to any noise signals generated therein. Moreover, as a practical matter, the amplifier circuit will almost invariably produce a noise signal which will be amplified by the remainder of the circuit. This signal when amplified, is supplied via switch 17 to pickup crystal 12 to cause fork 10 to oscillate. Obviously, this operation is a kind of boot strapping or positive feedback operation which includes such a high gain factor that within extremely short time (on the order of microseconds or less) fork 10 will be driven to oscillation by amplifier 13.

In addition, diodes D1 and D2 connected as a feedback path on the first stage of amplifier 13 will bias the first stage of the amplifier (i.e., devices P1 and N1) into the linear active region of its characteristic. The gate electrodes of devices P1 and N1 will be charged to a bias voltage approximately $V_{DD}/2$. Devices P2 and N2 are therefore biased to the linear active region of their characteristic also. Consequently, the circuit will be in an amplifying condition and producing a relatively large signal, whereby fork 10 will be driven into oscillation.

Thus, devices P1–N1, as well as amplifiers A1 and A3 are connected together as a three stage, high gain amplifier with feedback path comprising diodes D3 and D4. The low impedance devices P5 and N5 are rendered nonconductive, at this time, by the signals which are applied along lines 18A and 18B. With the three stage amplifier connected as suggested, the gain thereof is approximately 90 db and the feedback path is extremely high in impedance. Consequently these stages begin to oscillate at a very high frequency (i.e., several orders of magnitude higher than the fork frequency which may be approximately 480 Hz). The output of the amplifier is connected via device N3 to the drive crystal of fork 10. As suggested supra, this operation causes fork 10 to be driven even though initially there was no signal supplied thereby.

Fork 10 operates as a tank circuit and selects its resonant frequency from the high frequency oscillation supplied thereto. Only this resonant frequency is amplified by the amplifier and supplied the drive crystal. The fork oscillates, i.e., it cannot ring, because the high impedance driver included in amplifier A2 together with the capacitance of the driver crystal does not permit extremely rapid rise times of signals. Thus, the fork oscillation eliminates the high frequency oscillation because the fork oscillates only at its resonant frequency, and the overall loop gain is much higher at this frequency than at other frequencies. The signal produced at the output of amplifier A2 is shown as signal B in FIG. 4. Note that signal B is delayed almost 90° relative to signal A from fork 10. The fork is now oscillating with a 60° to 90° phase shift input-to-output (i.e., signals at devices 11 and 12) which is produced by the capacitance load of drive crystal 12 as seen by the high impedance driver of amplifier A2.

COMPARATOR SECTION

In addition, as suggested supra, the reference input (REF) of comparator 14 is connected to the same point as the input of amplifier A1 to receive signals from the amplifier-mixer stage. Thus, an oscillating signal produced by amplifier 13 is supplied to comparator 14. As suggested, the signal on the REF line is a highly amplified version of the input signal at pickup crystal 11. The signal at crystal 11 is a sinusoid (signal A, FIG. 4) which, when highly amplified and clipped, represents a signal which is substantially a square wave (signal C, FIG. 4).

The other input to comparator 14 is received from counter 19 which, in effect, divides the signal produced by VCO 16. For illustrative purposes, it may be stated that the signal supplied to terminal 14A of comparator 14 is the signal produced by VCO 16 frequency divided by 4. The input signal at terminal 14A is compared to the signal at the reference input. These signals are compared on the basis of both phase and frequency. The comparator is of any suitable design, several of which are known in the art.

In this embodiment, the signals at output terminals 25 and 26 are normally positive or binary 1 signals. A binary 1 on both of the output terminals indicates that both input signals are in phase and of the same frequency. In the event that the frequency of the VCO divided by 4 (VCO/4) is lower than the frequency of the reference signal, or if the VCO/4 lags, in phase, relative to the reference signal, a binary 0 is produced on output terminal 25. Conversely, if the frequency of VCO/4 is higher than the reference frequency or if the VCO/4 leads, in phase, relative to the reference signal, a binary 0 is produced on output terminal 26. The signals produced at terminals 25 and 26 are not continuous signals but recur every cycle. These signals produce a change in the VCO frequency in the required direction. As the error (i.e., difference between the signals being compared) decreases, the duration of the correction signals produced by the comparator decrease until spike-like signals are achieved. When frequency of VCO divided by 4 (VCO/4 ) is identical to the frequency of the reference signal, the output error signal (correction signal) is as long as the phase error and is representative thereof. Ultimately, the VCO/4 signal and the reference signal will reach equality both in phase and frequency. At this condition the signals at both output terminals will remain high or binary 1's. In this condition the phase lock loop portion of the circuit is in the locked-in condition.

In effecting control of the phase lock loop, the two outputs of the comparator 14 are supplied to charge pump 15 which includes devices P10 and N10. Specifically, terminal 26 is connected to the gate electrode of device P10 while terminal 25 is connected via inverter 27 to the gate electrode of device N10. The source and substrate of device P10 are connected to source $V_{DD}$. The source and substrate of device N10 are connected to source $V_{CC}$. The drain electrodes of devices N10 and P10 are connected together and to one terminal of capacitor C1. The other terminal of capacitor C1 is connected to source $V_{CC}$. Junction 28 (the first terminal of capacitor C1) is connected to the gate electrodes of devices N11 and P11 in VCO 16.

So long as the signals on terminals 25 and 26 both remain high, devices P10 and N10 remain nonconductive. When devices P10 and N10 are both nonconductive, the control voltage across capacitor C1 (as indicated at terminal 28) is not changed. However, if a binary 0 or low level signal appears at terminal 25, inverter 27 supplies a binary 1 or high level signal to the gate electrode of device N10, whereby this device is rendered conductive and terminal 28 is connected to source $V_{CC}$. Therefore, the control voltage at terminal 28 is lowered due to the conduction of device N10. Conversely, if a binary 0 appears at terminal 26, device P10 is rendered conductive and terminal 28 is connected to source $V_{DD}$. Thus, the voltage at terminal 28 is increased due to the conduction of device P10. As the control voltage at terminal 28 reaches zero volts ($V_{CC}$) VCO 16 should oscillate at its highest frequency ($f_h$). Conversely, when the control voltage at terminal 28 reaches $V_{DD}$ (through device P10), VCO 16 should oscillate with the lowest frequency ($f_l$). Clearly, the voltage at terminal 28 (across capacitor C1) controls the operation of VCO 16 as a function of the comparison of VCO/4 with the REF input signal by comparator 14. The frequency of the VCO output signal is increased or decreased as a direct result of the signals produced by comparator 14.

Devices P10 and N10 are high impedance devices and (in conjunction with the associated voltage sources) operate as current sources. Current is supplied to capacitor C1 from devices P10 and N10 in response to error signals from comparator 14. The voltage across capacitor C1 changes only by a small amount during one cycle of the signals supplied to the comparator. This circuit and operation provides the low-pass filtering required to ensure stable operation of the phase-locked-loop. That is, the VCO will not be overdriven and a "hunting" condition will not be induced.

VCO SECTION

Voltage controlled oscillator (VCO) 16 is connected to receive voltage signals from charge pump circuit 15. In particular, the control signal from the charge pump circuit is supplied to terminal 28. Terminal 28 is connected to the gate electrode of N-type semiconductor device N11 and to the gate electrode of P-type semiconductor device P11. The conduction path between the source and drain electrodes of semiconductor N11 is connected in parallel with (or across) capacitor C2. Capacitor C2 is connected between nodes D and E. Node D is also connected to the common junction of the gate electrodes of P-type device P12 and N-type device N12, respectively. The conduction paths of semiconductor devices P12 and N12 are connected in series between source $V_{DD}$ and source $V_{CC}$, ground or other suitable reference potential. The common junction of the conduction paths of semiconductors P12 and N12 is connected to a common junction of the gate electrodes of semiconductors P14 and N14. The conduction paths of semiconductors P14 and N14 are connected in series between the source $V_{DD}$ and source $V_{CC}$. Moreover, the common junction between the conduction paths of semiconductors P14 and N14 is connected to node E. It will be noted that semiconductor devices P12 and N12 comprise a standard type of COS/MOS inverter network. Semiconductors P14 and N14 form a second standard inverter circuit similar to the first inverter. In the inverter circuits, the substrates of the P devices are connected to source $V_{DD}$ while the substrates of the N devices are connected to source $V_{CC}$.

Node E is also connected to a common junction of the gate electrodes of semiconductor devices P15 and N15. The conduction paths of semiconductor devices P15 and N15 are connected in series between source $V_{DD}$ and source $V_{CC}$. The common junction between the semiconductor conduction paths is connected to output terminal 40. Semiconductor devices P15 and N15 form a third inverter similar to those described supra.

In addition, output terminal 40 is connected to the common junction of the source electrodes of the conduction paths of semiconductor devices P13, P11 and N13. The other terminals of the conduction paths of semiconductor devices P13, P11 and N13 are connected together at node D. The gate electrode of semiconductor N13 is connected to source $V_{DD}$ while the gate electrode of semiconductor device P13 is connected to source $V_{CC}$. The substrate of semiconductor devices P11 and P13 are connected to source $V_{DD}$ while the substrate of device N13 is connected to source $V_{CC}$.

Thus, it is seen that the voltage controlled oscillator shown in the circuit consists of three COS/MOS inverters, a high impedance transmission gate comprising semiconductor devices P13 and N13 and regulating units P11 and N11 in conjunction with a timing capacitor C2. In this embodiment, all parts of the circuit except for capacitor C2 may be integrated on a single monolithic chip using the COS/MOS process. However, other types of fabrication may be utilized.

In the preferred embodiment, the inverters comprising semiconductors P12, N12 and P14, N14 are connected in series between nodes D and E. Between nodes D and E the inverters establish an almost rectangular transfer characteristic. This type of operation is also described in U.S. Pat. No. 3,260,863 to J.R. Burns et al. entitled "Threshold Circuit Utilizing Field Effect Transistors." Thus, when the voltage at node D, for example, is below a predetermined threshold value (typically $V_{DD}/2$), node E is at $V_{CC}$ volts. Conversely, when the potential at node D is above the threshold value, node E is at the $V_{DD}$ level. When the voltage at node D is below the threshold level, the inverter comprising semiconductors P12 and N12 is, essentially, operative through the P12 device wherein the gate electrodes of devices P14 and N14 receive the $V_{DD}$ voltage. Obviously, with this voltage applied thereto, the inverter comprising devices P14, N14 is operative so that conduction occurs through the N14 device whereby node E is, essentially, connected to $V_{CC}$.

In describing the operation of the voltage controlled oscillator, it is initially assumed that the voltage at node D is $V_{CC}$. With this voltage condition, the voltage at node E is also $V_{CC}$ and the output signal (due to the operation of the inverter comprising devices P15 and N15) is $V_{DD}$. With this voltage condition, capacitor C2 charges through the transmission gate comprising devices P13 and N13. In addition, depending upon the control voltage, capacitor C2 may be charged through device P11. Furthermore, depending upon the voltage supplied at input terminal 28, device N11 may be operative to permit conduction through the conduction path thereof whereby a portion of the charging current is diverted away from the capacitor C2 and reduces the charging rate thereof.

As capacitor C2 charges, the voltage at node D rises. When the voltage at node D reaches the threshold of the inverter including devices P12 and N12, the output signal produced by the inverter is changed. Operation of the combination of the first and second inverters causes the voltage at node E to switch to $V_{DD}$. When the voltage at node E switches to $V_{DD}$, the third inverter produces an output voltage equal to $V_{CC}$ or zero volts. This signal will also be supplied through the transmission gate to capacitor C2.

Inasmuch as capacitor C2 is charged to at least the threshold voltage of the first inverter (e.g., $V_{DD}/2$), the voltage at node D attempts to switch to $V_{DD}$ plus the threshold value when the voltage at node E switches to $V_{DD}$. However, when the voltage at node D reaches $V_{DD}$ plus 0.7 volts, the P-N diodes at the P+ drain diffusions of the P11 and P13 devices conduct to the N− substrate, which is connected to $V_{DD}$, whereby the potential at node D cannot exceed $V_{DD}$ plus 0.7 volts. The discharge of the voltage at node D proceeds very rapidly inasmuch as the devices P14 and N14, as well as the diodes in devices P13 and N13 are low impedance devices. That is, because of the low impedance of the devices, the current therethrough is relatively high. Consequently, node D quickly assumes the potential level of $V_{DD}$ plus 0.7. At the same time node E is at potential $V_{DD}$ and the output signal is at $V_{CC}$ or zero potential.

Capacitor C2 is charged through semiconductor devices P11, P13 and N13 toward ground or zero volts at node D. Moreover, semiconductor device N11 continues to divert a portion of the charging current away from capacitor C2 as noted supra. At the instant when the potential at node D goes below the threshold potential of the inverters including P12, N12 and P14, N14, node E is switched to zero potential and the output signal swtiches to the $V_{DD}$ level. At this moment, capacitor C2 is charged to the level $V_{DD}$ minus threshold value. Therefore, node D tends to reach the level of $V_{CC}$ minus the threshold value. At this voltage condition, the N+ drain diffusions of the N11 and N13 devices conduct to the P− substrate which is connected to $V_{CC}$ when node D reaches $V_{CC}$ minus 0.7 volts. As a result, the potential at node D cannot drop more than 0.7 volts below $V_{CC}$.

This discharge operation progresses rapidly inasmuch as the devices are low impedance devices. When this discharge operation is completed, the circuit is now returned to the initial condition and has completed one cycle. The cycle time is determined by the impedances of semiconductor devices P11, P13, N11 and N13. In this embodiment, semiconductor devices P13 and N13 are defined to be fixed in impedance. However, the impedance of devices P11 and N11 are variable as suggested supra. When the impedance of P11 is increased and the impedance of device N11 is decreased, the cycle time becomes longer and the oscillation frequency is lower. This operation is accomplished by raising the DC voltage of the control input. Thus, when the threshold of device P11 is reached, it is rendered completely nonconductive and the impedance thereof is not varied. However, semiconductor device N11 continues to change in impedance with the increasing of the control voltage to $V_{DD}$. Of course, if the control input signal falls below the N-threshold voltage of device N11, this device is also rendered totally nonconductive and the impedance thereof will not change with the lowering of the control voltage. However, in this condition, semiconductor device P11 will continue to change its impedance with the reduction of the control voltage down to zero volts.

Thus, the voltage controlled oscillator changes its operating frequency as a direct result of the changing of the DC voltage of the control input at terminal 28 over the full range of zero volts to $V_{DD}$. The change in frequency of the circuit is always in the same direction as and in direct response to the voltage control input signal. In the embodiment shown, the circuit operates at its highest frequency when the control input signal is zero volts. Conversely, the circuit operates at its lowest frequency when the control input is $V_{DD}$. Moreover, by carefully selecting the dimensions of devices P11, N11, P13 and N13 in the integrated circuit version, an almost linear dependence of frequency verses control voltage can be achieved. Moreover, in this embodiment, the voltage controlled oscillator input has a very high impedance (typically $10^{11}$ ohms) such that there is essentially no loading of the control voltage source.

In an alternative arrangement, temperature dependence of the circuit can be compensated against by connecting the gate electrodes of devices P13 and N13 to a DC voltage which has opposite temperature characteristics than the oscillator rather than connecting these gate electrodes to $V_{CC}$ and $V_{DD}$, respectively.

COUNTER 19 SECTION

The output of VCO 16 is connected to the input of counter 19. If, in practical implementation, a second complementary input is required, the output of VCO 16 may also be supplied to an inverter (not shown). The output of the inverter is supplied to another input of counter 19 whereby complementary input signals are supplied to the counter. In particular, counter 19 includes a pair of flip-flops labeled FF1 and FF2 and designated with the reference numerals 30 and 31, respectively. The flip-flops in counter 19 are connected together to form a so-called Johnson counter which uses a different counting technique than the standard ripple-counter circuit and counts (or divides) by four. In counter 19, the output of VCO 16 is connected to the clock input terminals of flip-flops 30 and 31, respectively. (An inverted VCO output signal, if provided, is supplied to the clock terminals of flip-flops 30 and 31.) The Q1 output terminal of flip-flop 30 is connected to the D input of flip-flop 31 and, via inverter 32 to the source electrode of device N4 in switch 17, as described supra. The Q1 output is also connected to the toggle input of counter 20. The $\overline{Q1}$ output of flip-flop 30 is connected to one input of starting logic circuit 18.

The Q2 output of flip-flop 31 is connected to terminal 14A of comparator 14 and to an input of starting logic circuit 18. The $\overline{Q2}$ output of flip-flop 31 is connected to an input of starting logic circuit 18 and to the D input of flip-flop 30. The operation of a Johnson counter, such as counter 19, is illustrated in Table I.

TABLE I

| CLOCK | Q1 | Q2 |
|---|---|---|
| 0 | 0 | 0 |
| 1 | 1 | 0 |
| 2 | 1 | 1 |
| 3 | 0 | 1 |
| 4 | 0 | 0 |
| 5 | 1 | 0 |

The operation of the counter is cyclic and repeats at clock pulse 4, whereby a divide-by-four operation is achieved. Thus, it is seen that a Johnson counter, which in this application is responsive to a positive going clock pulse, produces a different output than is standard in a typical ripple counter. Johnson counters are known in the art. Therefore, a detailed description thereof is deemed unnecessary. However it should be noted that the Johnson counter operation is directly related to the signals applied at the D inputs.

The Q1 output of flip-flop 30 is supplied, via inverter 32 to the source electrode of device N4 of switch 17. This signal represents the 90° phase point of the signal produced by VCO 16 in response to a sinusoidal input signal supplied by fork 10. The Q2 output signal supplied by flip-flop 31 is the zero degree phase point of the signal produced by VCO 16 and is supplied to terminal 14A for comparison with the reference signal (REF) supplied by amplifier 13. The operation of the Q1 and Q2 signals has been previously described relative to the application thereof to comparator 14 and switch 17.

STARTING LOGIC SECTION

The Q2, $\overline{Q2}$ and $\overline{Q1}$ signals are supplied from counter 19 to starting logic circuit 18, along with the signals at terminals 25 and 26 of comparator 14. In particular, terminals 25 and 26 are connected to separate input terminals of NAND gate 29. Consequently, if the VCO signal is different from the REF signal, a binary 0 will be supplied to NAND gate 29 at terminal 25 or 26. In this instance, NAND gate 29 produces a high level output signal. The output of NAND gate 29 is connected to one input of AND gate 75. An inverting input terminal of AND gate 75 is connected to receive the $\overline{Q1}$ output signal from flip-flop 30. AND gate 75 produces a high level or binary 1 output signal when the $\overline{Q1}$ signal is low (i.e., binary 0) and the output signal from NAND gate 29 is a high level signal or a binary 1. The $\overline{Q1}$ signal is a low level signal during time period II (see FIG. 5) and NAND gate 29 produces a high level output signal whenever comparator 14 indicates a lack of identity of the input signals.

The output of AND gate 75 is connected to one input of gate 79 or preset flip-flop (FFP) and to one input of gate 77 of start flip-flop (FFS). The output of NOR gate 79 is connected to one input of three input AND gate 78 and to an input of NOR gate 80 of flip-flop FFP. The output of NOR gate 80 is returned to a second input of NOR gate 79. A further input of NOR gate 80 is connected to the output terminal of AND gate 81 which receives one input signal from the $\overline{Q2}$ output of flip-flop 31 and another input from the $\overline{Q1}$ output of flip-flop 30. Gate 81 operates on the high level $\overline{Q1}$ and $\overline{Q2}$ signals which occur during time period I (see FIG. 5).

The $\overline{Q1}$ output of flip-flop 30 is also connected to another input of the three input AND gate 78. The third input of AND gate 78 is connected to receive the Q2 signal from flip-flop 31. Gate 78 operates on the $\overline{Q1}$ and Q2 signals which are concurrently high level signals at time period III (see FIG. 5). The output of AND gate 78 is connected to one input of NOR gate 76 of flip-flop FFS. The output of gate 76 is connected to one input of NOR gate 77 and to switch circuit 17 via line 18A. The output of gate 77 is connected to a second input of NOR gate 76 and, along line 18B, to switch 17.

Figure 5:
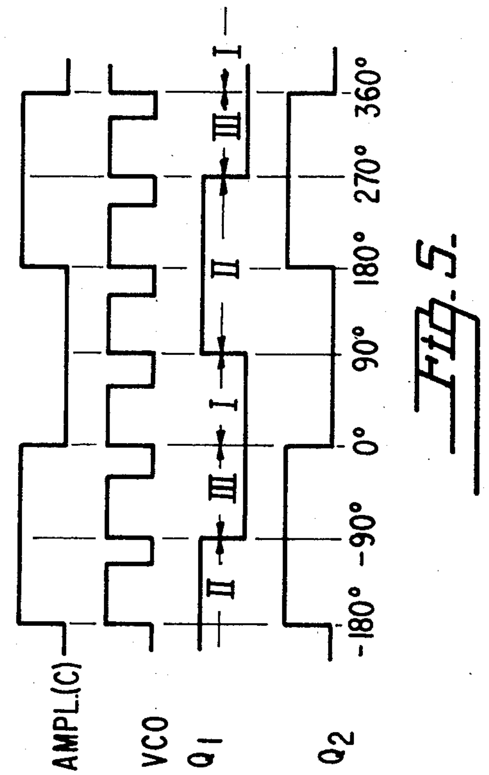
FIGS. 4 and 5 are diagrams of the signal waveforms for the circuits shown in FIGS. 1–3.

The operation of starting logic circuit 18 is best understood by concurrent reference to the circuit diagrams of FIGS. 1 and 2 along with the timing diagram of FIG. 5. The signal C shown in FIG. 5 is supplied to the reference terminal (REF) of comparator 14 as described supra. The VCO signal is supplied to the clock inputs of flip-flops 30 and 31 of counter 19. The Q2 output signal of counter 19 (flip-flop 31) is supplied to input terminal 14A of comparator 14. The Q2 and Q1 signals are supplied to starting logic circuit 18. As noted supra, comparator 14 compares the signals supplied thereto on the input terminals with respect to both frequency and phase. The signals supplied by comparator 14 on output terminals 25 and 26 are binary 1 signals if an identity in the input signals occurs as shown in FIG. 5. However, in the event that either a phase or frequency difference exists between the input signals, a binary 0 is supplied on one of the output terminals.

In the initial condition, the signals supplied to the input terminals of comparator 14 are generally not of the same frequency and phase. Consequently, a binary 0 is generally supplied on either output terminal 25 or output terminal 26. That is, the signal supplied at the REF terminal is determined by the input circuit including fork 10 and amplifier 13. Normally, this signal will be on the order of the resonant frequency of fork 10, e.g. 480 Hz. However, in some initial start up conditions an uncontrolled (i.e., undamped by fork 10) oscillation signal may be supplied to the reference terminal. Similarly, VCO 16 is designed to produce an output signal having a range of approximately 1,300 to 3,000 Hz. This frequency range is determined by the capacitance value of capacitor C2 and the impedance values of devices P11 and N11. In the initial condition it is assumed that there is no voltage drop across capacitor C1 wherein the voltage at terminal 28 is zero volts. Thus, the maximum frequency of VCO 16 (e.g., 3,000 Hz) is generated and this signal is supplied to Johnson counter 19. Counter 19 divides the signal by four and supplies a VCO divided-by-four signal (VCO/4) of about 750 Hz to terminal 14A. Consequently, a signal will be applied to at least terminal 14A and perhaps both input terminals of comparator 14. These signals are unlikely to be of the same frequency and phase without the control circuit operation.

Consequently, a binary 0 output signal is supplied at either terminal 25 or terminal 26. In this example, i.e., a 750 Hz signal supplied to terminal 14A, a binary 0 will be applied to terminal 26. This signal is supplied to charge pump network 15 which effects a change in the frequency of the VCO output signal, as described supra.

The output signals at terminals 25 and 26 are also supplied to input terminals of NAND gate 29. If there is a lack of identity of input signals at comparator 14, a binary 0 is supplied to at least one input of NAND gate 29. In response to a binary 0 input signal, NAND gate 29 produces a high level output signal which is supplied to an input of AND gate 75. At time period II, the low level $\overline{Q1}$ signal from flip-flop 30 is supplied to the inverting input of AND gate 75. As a result, AND gate 75 produces a high level output signal which is supplied to an input of flip-flop FFP at the input of gate 79 and to an input of gate 77 of flip-flop FFS. Therefore, gates 79 and 77 each produce low level output signals which are supplied to inputs of NOR gates 80 and 76, respectively. The low level signal from gate 79 causes AND gate 78 to supply a low level signal to gate 76. Thus, gate 76 receives all low level signals and produces a high level output signal. This signal enables switch 17 to connect the output of amplifier 13 to fork 10. This is the operation by which a correction signal is detected and the phase locked loop is not completed.

Considering now the operation of starting logic 18 with reference to the timing diagram shown in FIG. 5, it will initially be assumed that a locked-in condition (as exemplified by the timing diagram of FIG. 5) is in existence. If the locked-in condition exists, the signals at terminals 14A and REF of comparator 14 are in phase and of the same frequency. Consequently, both signals at terminals 25 and 26 are relatively high or binary 1 signals. In this condition, binary 1 signals are supplied to both inputs of NAND gate 29. Consequently, NAND gate 29 produces a low level output signal which is supplied to one terminal of gate 75. Inasmuch as the comparator 14 operates on the negative going edge of the signals supplied thereto, this signal portion is arbitrarily defined as the zero degree condition. Furthermore, inasmuch as VCO 16 produces a signal which, in a locked-in condition, is equal to four times the frequency of the amplifier signal, the signals produced by counter 19 are defined in terms of a 90° signal or phase shift. For the first 90° of the amplifier signal, output signals Q1 and Q2 from Johnson counter 19 are both low level signals. Of course, the $\overline{Q1}$ and $\overline{Q2}$ signals are of the opposite or complementary level (see Table I supra). During the first 90° signal portion or time slot I, a $\overline{Q2}$ signal (binary 1) is supplied to an input of AND gate 81 of flip-flop FFP. Also, a binary 1 signal is supplied to another input of AND gate 81 from the $\overline{Q1}$ output of flip-flop 30. Consequently, gate 81 produces a high level signal which is supplied to an input of NOR gate 80. As a result, NOR gate 80 is forced to supply a low level or binary 0 output signal which is applied to one input of NOR gate 79.

The binary 1 signal $\overline{Q1}$ is also applied to the inverting input of gate 75. Consequently, gate 75 also produces a low level output signal which is supplied to another input of NOR gate 79 and to an input of NOR gate 77. Consequently, NOR gate 79 is forced to produce a high level or binary 1 output signal and flip-flop FFP is considered in the "set" condition.

The binary 1 signal from NOR gate 79 is supplied to one input of three input AND gate 78. Another input of AND gate 78 is supplied by the $\overline{Q1}$ signal of flip-flop FF30 which is also a high level signal at this time. However, a further input of NOR gate 78 is supplied by the Q2 output of flip-flop FF31 which, by definition, is a low level or binary 0 signal at this time. Consequently, AND gate 78 produces a low level or binary 0 signal which is supplied to an input of NOR gate 76. Thus, an indeterminate condition exists at the output of flip-flop FFS during time period I except as defined by prior history, as will appear hereinafter.

At time slot II, i.e., from the 90° to 270° portion of the signal cycle, the correction pulses, if any, which appear as binary 0's at terminals 25 and 26 are supplied to reset flip-flops FFP and FFS. That is, gate 75 is now enabled by the application of a binary 0 input signal to the inverting input terminal thereof from the $\overline{Q1}$ output of flip-flop 30. Similarly, any low or binary 0 signal at an input of NAND gate 29 will cause a high level output signal to be produced thereby. The combination of the low level $\overline{Q1}$ signal applied to the inhibit terminal of gate 75 and the high level or binary 1 signal applied to the other terminal of gate 75 causes a high level signal to be produced thereby. Application of this high level signal to inputs of NOR gates 79 and 77 causes these gates to produce low level output signals whereby the respective flip-flops are reset. When this condition occurs, i.e., a correction pulse is provided by comparator 14, and flip-flop FFS is reset, the signal supplied along line 18B becomes a binary 0 wherein that portion of switch 17 which connects the output of flip-flop 30 to drive crystal 12 via inverter 32 is rendered nonconductive. Conversely, amplifier 13 is connected via the appropriate portion of switch 17 to drive crystal 12 so that fork 10 is driven by the amplifier network. This operation is described supra. Of course, if the signals are in the locked-in condition and no correction pulse is supplied by comparator 14 during time slot II (i.e., the phase locked loop (PLL) is locked in), the preset flip-flop (FFP) remains in the condition previously described and continues to provide a high level or binary 1 output signal to an input of AND gate 78.

During time period III, i.e. the 270° to 360° portion of the amplifier signal, the signal supplied by the Q2 portion of flip-flop 31 switches high and is applied to the third input of AND gate 78. Moreover, the $\overline{Q1}$ signal is also high at this time whereby all of the signals applied to AND gate 78 are high level signals. Consequently, AND gate 78 produces a high level or binary 1 output signal which is supplied to an input of NOR gate 76. As a result, NOR gate 76 produces a low level or binary 0 output signal which is applied to gate 77 to cause this gate to produce a high level output signal. The high level signal from gate 77 is applied to switch 17. In addition, the low level signal from gate 76 is applied to switch 17. This signal combination causes switch 17 to connect the output of counter 19 to drive crystal 12 via inverter 32 and switch 17 whereby the signal from counter 19 is applied to fork 10 to reinforce the operation thereof and to maintain the system in a phase lock loop, locked-in operation.

In addition, the signals on lines 18A and 18B are supplied to the gate electrodes of devices P5 and N5 to render these devices conductive at this time. When these devices are conductive, devices P6 and N6 are short circuited thereby. With this circuit configuration, the feedback loop including diodes D3 and D4 from the drive crystal 12 to the amplifier is essentially eliminated.

COUNTER 20 SECTION

Counter 20 shown in FIG. 3 includes a pluraltiy of flip-flops. In this case, four flip-flops FF3, FF4, FF5 and FF6 are designated flip-flops 320, 33, 34 and 35 inclusive. The toggle or clock input of flip-flop 320 is connected to receive the Q1 signals from flip-flop 30 of counter 19. The $\overline{Q1}$ signals can be used if desired. Moreover, if the flip-flops include a pair of clock terminals, both the Q1 and $\overline{Q1}$ signals can be utilized. The Q3 output from flip-flop 320 is connected to the toggle input of flip-flop 33. The Q4 output of flip-flop 33 is connected to the toggle input of flip-flop 34. The Q5 output from flip-flop 34 is connected to the toggle input of flip-flop 35. The Q6 and $\overline{Q6}$ outputs of flip-flop 35 are connected to the gate electrodes of P-type devices P3 and P4, respectivley, of regulator 22 which will be described hereinafter. Counter 20 operates as a standard ripple counter as shown in Table II.

TABLE II

| CLOCK | Q3 | Q4 | Q5 . . . |
|---|---|---|---|
| 0 | 0 | 0 | 0 |
| 1 | 1 | 1 | 1 |
| 2 | 0 | 1 | 1 |
| 3 | 1 | 0 | 1 |
| 4 | 0 | 0 | 1 |
| 5 | 1 | 1 | 0 |

That is, on the positive going edge of a clock or toggle signal, a flip-flop is caused to change state. In the operation of counter 20, the frequency of the signal suplied thereto by flip-flop 30 is divided by 16.

REGULATOR SECTION

The signal from flip-flop 35 of counter 20 is supplied to regulator 22 as suggested supra. Regulator 22 includes basically three circuit components. These circuit components comprise a reference voltage generator 50, a voltage regulator 51 and a motor regulator and driver 52. Reference generator 50 and voltage regulator 51 are shown and described in the copending application of Goetz Steudel, entitled "Reference Voltage Generator and Regulator" bearing Ser. No. 204,224, filed on Dec. 2, 1971, and assigned to the same assignee as the present application. A detailed description of the operation and configuration of the circuits is deemed unnecessary at this point. However, it should be noted that reference voltage source 50 produces reference voltages at nodes X and Y which reference voltages are supplied to regulator 51. Regulator 51 utilizes the reference voltages at nodes X and Y to produce a regulated output signal $V_{CC}$ which is supplied to the remainder of the circuit as shown and described supra. Inasmuch as this portion of the circuit utilizes COS/MOS integrated circuit techniques, the regulator may be integrated on the same chip (or chips) as the overall system.

Motor regulator and driver 52 is substantially similar to regulator 51. The operation of this circuit is also described in the aforementioned copending application of Goetz Steudel. Thus, the output voltage on line 53 and supplied to utilization device 21 has an amplitude which is regulated quite accurately to a prescribed level. The prescribed level is controlled by the reference voltage at node X as provided by reference generator 50.

However, the current supplied by P-type device P17 (which is connected as a current source) to differentially connected P-type devices P18 and P16 is controlled by P-type device P3. That is, the conduction paths of devices P3 and P17 are connected in series. Therefore, if device P3 is operated as a switch, the current applied to differentially connected devices P18 and P16 is dependent upon the condition of device P3. The gate electrode of device P3 is connected to the Q6 output terminal of flip-flop 35. Consequently, device P3 is conductive or nonconductive depending upon the signal supplied at output terminal Q6 of transistor 35. The combination of counters 19 and 20 causes the output signal produced by flip-flop 35 to be equal to one sixty-fourth of the frequency produced by VCO 16. Consequently, the operating frequency of motor regulator circuit 52 is approximately 30 Hz.

As suggested supra, utilization device 21 may be a synchronous motor which is utilized in an automobile clock or the like. This device receives a 30 Hz signal at line 53 from motor regulator 52. Utilization device 21 operates upon this 30 Hz signal to drive the hands of a clock or the like and to, therefore, maintain relatively accurate time indication. Of course, a different utilization device and, therefore, a different signal frequency might be utilized by the circuit.

SWITCH SECTION

As noted supra, switch 17 in FIG. 2 is a symbolic representation of a switching circuit, which in theory may be satisfactory. However, referring now to FIG. 6, there is shown a schematic diagram of a switching network which may be utilized in this circuit as an alternative to the switch network shown in FIG. 2 to assure proper circuit operation. In order to better describe the function of switching circuit 17, amplifier 13, counter 19 and starting logic 18 are shown. The remainder of the circuit is omitted for clarity.

In addition, a modification of the amplifier A2 is also included. Amplifier A2 includes P-type devices P24 and P25 as well as N-type devices N24 and N25. The conduction paths of devices P25, P24, N24 and N25 are connected in series. The source electrode of device P25 is connected to source $V_{DD}$ while the source electrode of device N25 is connected to source $V_{CC}$. The drain and source electrodes of devices N25 and N24, respectively, are connected together as are the source and drain electrodes, respectively, of devices P24 and P25. Thus, the drain electrodes of devices P24 and N24 are connected together and to node 90 which is connected to the fork drive as well as to the cathode of diode D4 in the feedback path comprising diodes D3 and D4. In addition, the gate electrodes of devices P24 and N24 are connected together and to the output of amplifier A1. Line 18A, from starting logic circuit 18, is connected to the gate electrode of device N25 and to amplifier 13 (e.g., the gate electrode of device P5 in FIG. 2). Also, line 18B is connected to the gate electrode of device P25 and amplifier 13 (e.g., the gate electrode of device N5 in FIG. 2). Line 18B is connected to line 18A via inverter 91. Devices P5 and N5 are shown in FIG. 2.

The switching circuit 17, per se, includes devices P26, P27, N26 and N27. The conduction paths of these devices are connected in series. The source electrode of device P26 is connected to source $V_{DD}$ while the drain electrode thereof is connected to the source electrode of device P27. The drain of device P27 is connected to the drain electrode of device N27. The source electrode of device N27 is connected to the drain of device N26 which has the source electrode thereof connected to source $V_{CC}$. The gate electrodes of devices P27 and N27 are connected together and to the Q1 output of counter 19. The gate electrode of device N26 is connected to line 18A via inverter 91. The gate electrode of device P26 is connected to line 18A.

Figure 6:
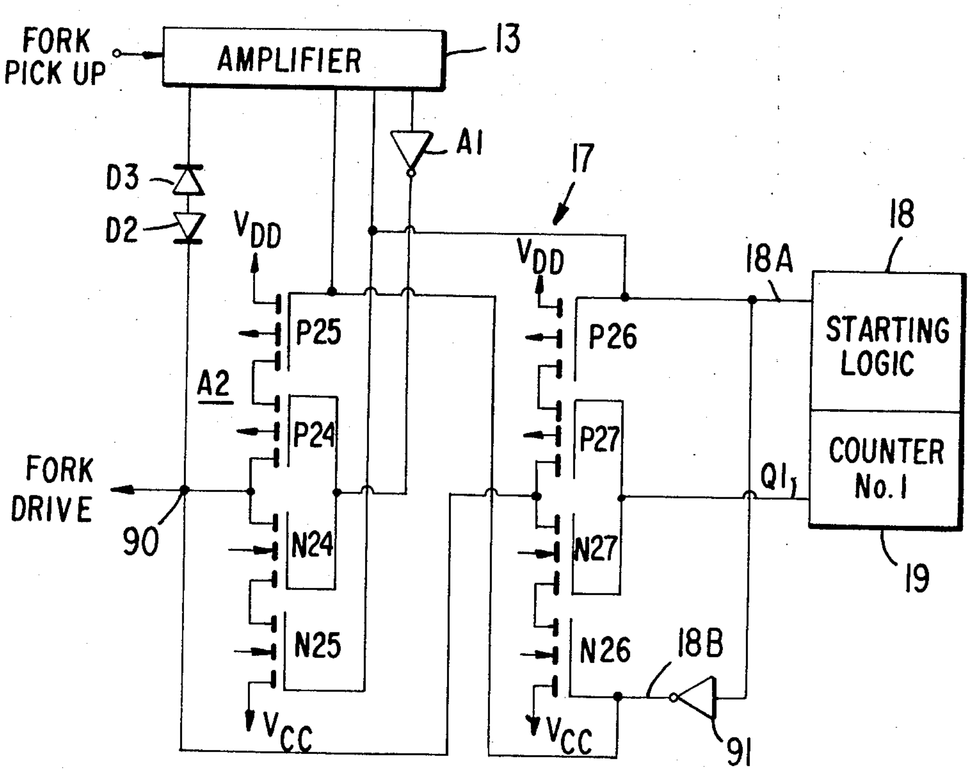
FIG. 6 is a schematic diagram of a switch circuit used in practicing the instant invention.

In operation of the circuit shown in FIG. 6, amplifier 13 provides the signal described supra from amplifier A1 and starting logic circuit 18 provides the signals described for its operation along lines 18A and 18B. Consequently, in the event that the circuit is not in the locked-in condition, a binary 1 signal is supplied along line 18A to the gate electrodes of devices P26 and N25 as well as to amplifier 13. This positive signal renders device P26 nonconductive and device N25 conductive. Moreover, this signal is inverted by inverter 91 and supplied as a low level or binary 0 signal on line 18B to the gate electrode of devices N26 and P25 and to amplifier 13. As a result, device P25 is rendered conductive and device N26 is rendered nonconductive. Also, devices P5 and N5 are nonconductive. The Q1 signal from counter 19 is supplied to the gate electrodes of devices P27 and N27. Device P27 is rendered conductive and device N27 is rendered nonconductive alternatively as the Q1 signal changes. Normally, devices N27 and P27 operate as an inverting amplifier wherein the signals produced thereby would be supplied to common terminal 90 which is connected thereto. However, devices P26 and N26 are nonconductive whereby the circuit is nonconductive. Conversely, with devices P25 and N25 conductive, the signal supplied to the gate electrodes of devices P24 and N24 by amplifier A1 is operated upon by amplifier A2 and an appropriate signal is supplied to terminal 90.

On the contrary, when the phase lock loop is operating and is in the locked-in condition, a binary 0 signal is applied along line 18A to the gate electrodes of devices P26 and N25. Moreover, this binary 0 signal is inverted by inverter 91 and a binary 1 is supplied along line 18B to the gate electrodes of devices N26 and P25. With these signal conditions, devices P25 and N25 are nonconductive while devices P26 and N26 are conductive. Consequently, amplifier A2 is effectively nonconductive whereby amplifier A1 (and amplifier 13) is disconnected from node 90 and, thus, the fork drive. However, the inverter comprising devices P27 and N27 is operative and the Q1 signal is supplied to frok drive at node 90.

Thus, there is described a preferred embodiment of the instant invention which relates to timing devices using a tuning fork as the control element. The accuracy of the frequency of a tuning fork, as well as a crystal, is dependent upon the accuracy of the phase-shift between the pick-up-signal and the drive-signal. This phase-shift should preferably be 90° and should be independent of variations of supply voltage, temperature and component characteristics. The described circuit provides excellent 90° phase-shift by means of the phase-locked-loop and, as well, a 60° to 90° phase-shift when the fork is started and the phase-locked-loop is not locked in. Typically, the starting operation requires about 1 second until the circuit is fully locked-in and, thereafter, as long as power is supplied to the circuit the phase-locked-loop supplies the signal for the fork. Moreover, variations of parameters do not adversely affect the stable 90° phase-shift of the phase-locked-loop. It is to be noted that changes or modifications in the circuit such as the number of divisions which are made by the frequency counters, the specific frequencies involved, the voltages involved and the like may be made. Moreover, the logic operation may be changed to operate on the inverted signal levels or the like. The description herein is intended to be illustrative only and is not meant to be limitative of the instant invention. Rather, it is understood that those skilled in the art may prefer to modify these and other appropriate facets of the invention. However, so long as the spirit of the invention is utilized, it is intended to be covered by this application. The scope of the invention is determined by the appended claims.

What is claimed is:

1. In combination:

a signal source having a resonant frequency:

amplifier means connected to receive the signals from said source for amplifying said signals;
oscillator means;
first control means responsive to the frequency relationship between the signals produced by said amplifier means and the signals produced by said oscillator means for producing an output signal having a predetermined phase and frequency relationship to the signals produced by said signal source, when said signal source is operating at its resonant frequency; and
second control means for connecting said first control means to drive said signal source when said output signal of said first control means has said predetermined phase and frequency relationship to the signal produced by said signal source and for connecting said amplifier means to drive said signal source at other times.

2. In the combination as set forth in claim 1, said first control means including frequency divider means responsive to said oscillator means and comparator means for comparing the frequency and phase of the signals produced by said frequency divider means with the frequency and phase of the signals produced by said amplifier means, and means responsive to the output signal produced by said comparator means for controlling the frequency of said oscillator means.

3. In the combination as set forth in claim 2, said frequency divider means comprising a counter.

4. In the combination as set forth in claim 1, said second control means including switch means for selectively connecting said signal source to receive signals from one of said amplifier means and first control means.

5. In the combination as set forth in claim 1, said oscillator means comprising a voltage controlled oscillator and said first control means comprising a comparator for controlling the frequency of said voltage controlled oscillator.

6. In the combination as set forth in claim 4, said second control means including a pair of flip flops, each connected to receive a signal from said first control means and another signal from said comparator means, one of said flip flops supplying signals to the other of said flip flops and said other flip flop connected to control said switch means.

7. The combination of:
a frequency standard which, when driven into oscillation, tends to oscillate at its resonant frequency;
amplifier means connected to receive the signal produced by said frequency standard and initially connected to drive said frequency standard into oscillation;
a phase locked loop driven by said amplifier means; and
means responsive to a signal produced by said phase locked loop at a frequency having a predetermined relationship to the resonant frequency of said frequency standard and having a phase bearing a predetermined relationship to the phase of the oscillations produced by said frequency standard for connecting said phase locked loop to drive said frequency standard and disconnecting said amplifier means from driving said frequency standard.

8. The combination as set forth in claim 7 wherein said frequency standard comprises a tuning fork and means for translating the mechanical oscillations of said tuning fork into electrical oscillations.

9. The combination as set forth in claim 7 wherein said phase locked loop includes a voltage controlled oscillator, a frequency divider driven by said voltage controlled oscillator, and means for comparing the frequency of the signal produced by said frequency divider with that produced by said amplifier means.

10. The combination as set forth in claim 7 wherein said means responsive to a signal produced by said phase locked loop comprises means responsive to a signal at the resonant frequency of said frequency standard and in a predetermined phase relationship to the signal produced by said frequency standard.

11. The combination as set forth in claim 7 wherein said amplifier means comprises a high gain amplifier having a regenerative feedback loop, and further including means for effectively disabling said feedback loop when said phase locked loop is driving said frequency standard.

12. The combination as set forth in claim 11 wherein said amplifier means comprises four field effect transistors, the conduction paths of two connected essentially in series between an output terminal and one operating voltage terminal and conduction paths of the other two transistors connected essentially in series between said output terminal and the second operating voltage terminal, and wherein said feedback path extends between said output terminal on the one hand and the control electrodes of two of said transistors on the other hand, said two transistors comprising one between said output terminal and one of said operating voltage terminals and the other between said output terminal and the other operating voltage terminal, and wherein said means for effectively disabling said feedback path comprises means for effectively shortcircuiting the conduction paths of said last-mentioned two transistors.

13. The combination as set forth in claim 12 wherein the two transistors on one side of said output terminal comprise transistors of one conductivity type and the other two transistors comprise transistors of another conductivity type.

* * * * *